(12) United States Patent
Kang et al.

(10) Patent No.: US 12,081,048 B2
(45) Date of Patent: Sep. 3, 2024

(54) APPARATUS AND METHOD FOR BALANCING BATTERY PACKS CONNECTED IN PARALLEL

(71) Applicant: LG ENERGY SOLUTION, LTD., Seoul (KR)

(72) Inventors: Su-Won Kang, Daejeon (KR); Han-Sol Kim, Daejeon (KR); Bum-Hee Lee, Daejeon (KR); Sang-Ki Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 461 days.

(21) Appl. No.: 17/435,326

(22) PCT Filed: Oct. 22, 2020

(86) PCT No.: PCT/KR2020/014528
§ 371 (c)(1),
(2) Date: Aug. 31, 2021

(87) PCT Pub. No.: WO2021/080358
PCT Pub. Date: Apr. 29, 2021

(65) Prior Publication Data
US 2022/0140620 A1 May 5, 2022

(30) Foreign Application Priority Data

Oct. 22, 2019 (KR) .................... 10-2019-0131694
Oct. 21, 2020 (KR) .................... 10-2020-0136984

(51) Int. Cl.
*H02J 7/00* (2006.01)
*B60L 58/22* (2019.01)
(Continued)

(52) U.S. Cl.
CPC ............ *H02J 7/0016* (2013.01); *B60L 58/22* (2019.02); *G01R 31/3842* (2019.01);
(Continued)

(58) Field of Classification Search
None
See application file for complete search history.

(56) References Cited

U.S. PATENT DOCUMENTS

2008/0156551 A1* 7/2008 Kawahara ............... B60L 58/12
320/134
2010/0019724 A1 1/2010 Mizutani et al.
(Continued)

FOREIGN PATENT DOCUMENTS

CN 102299529 B 4/2014
EP 2 919 360 A1 9/2015
(Continued)

OTHER PUBLICATIONS

International Search Report for PCT/KR2020/014528 (PCT/ISA/210) mailed on Feb. 2, 2021.
Extended European Search Report for European Application No. 20878410.8 issued on Oct. 4, 2022.

*Primary Examiner* — Arun C Williams
(74) *Attorney, Agent, or Firm* — Birch, Stewart, Kolasch & Birch, LLP

(57) ABSTRACT

Disclosed is an apparatus and method for balancing battery packs connected in parallel. If the pack voltage deviation of the first to $n^{th}$ battery packs is greater than the first threshold value, a battery cell having a higher voltage than the pack balancing target voltage set according to a preset criterion among the voltages of all cells is discharged to perform pack balancing for each battery pack and if the pack voltage deviation is equal to or smaller than the first threshold value, a battery cell having a higher voltage than the cell balancing target voltage set according to a preset criterion among the (Continued)

voltages of the cells included in a battery pack having a cell voltage deviation greater than the second threshold value is discharged to perform cell balancing for each battery pack.

16 Claims, 5 Drawing Sheets

(51) Int. Cl.
*G01R 31/3842* (2019.01)
*G01R 31/396* (2019.01)
*H01M 10/42* (2006.01)

(52) U.S. Cl.
CPC ........ *G01R 31/396* (2019.01); *H01M 10/425* (2013.01); *H02J 7/007182* (2020.01); *H01M 2010/4271* (2013.01); *H01M 2220/20* (2013.01)

(56) References Cited

U.S. PATENT DOCUMENTS

| | | | |
|---|---|---|---|
| 2011/0074354 A1* | 3/2011 | Yano | H01M 10/482 180/65.29 |
| 2011/0127964 A1 | 6/2011 | Nishida et al. | |
| 2011/0140650 A1 | 6/2011 | Zhang et al. | |
| 2012/0313439 A1 | 12/2012 | Yamaguchi et al. | |
| 2014/0347013 A1 | 11/2014 | Kim | |
| 2019/0181653 A1* | 6/2019 | Wu | B60L 58/15 |

FOREIGN PATENT DOCUMENTS

| | | |
|---|---|---|
| JP | 2006-254535 A | 9/2006 |
| JP | 2010-29050 A | 2/2010 |
| KR | 10-2011-0028343 A | 3/2011 |
| KR | 10-1416798 B1 | 7/2014 |
| KR | 10-2014-0138067 A | 12/2014 |
| KR | 10-1601714 B1 | 3/2016 |
| KR | 10-1641445 B1 | 7/2016 |

\* cited by examiner

FIG. 3

|  | FIRST BATTERY PACK | SECOND BATTERY PACK | ..... | $N^{TH}$ BATTERY PACK |
|---|---|---|---|---|
| PACK BALANCING | YES | YES | ..... | YES |
| FIRST BATTERY CELL | 3.8 | 3.8 | ..... | 3.6 |
| SECOND BATTERY CELL | 3.7 | 3.9 | ..... | 3.5 |
| THIRD BATTERY CELL | 3.6 | 4 | ..... | 3.5 |
| FOURTH BATTERY CELL | 3.55 | 3.9 | ..... | 3.4 |
| ..... | ..... | ..... | ..... | ..... |
| $P^{TH}$ BATTERY CELL | 3.72 | 3.5 | ..... | 3.4 |
| PACK VOLTAGE | 18.37 | 19.1 | ..... | 17.4 |
| PACK VOLTAGE DEVIATION | 0.73 |  |  | -1.7 |

FIG. 4

|  | FIRST BATTERY PACK | SECOND BATTERY PACK | ..... | $N^{TH}$ BATTERY PACK |
|---|---|---|---|---|
| PACK BALANCING | NO | NO | ..... | NO |
| CELL BALANCING | YES | YES | ..... | NO |
| FIRST BATTERY CELL | 3.65 | 3.6 | ..... | 3.5 |
| SECOND BATTERY CELL | 3.6 | 3.7 | ..... | 3.45 |
| THIRD BATTERY CELL | 3.55 | 3.6 | ..... | 3.45 |
| FOURTH BATTERY CELL | 3.52 | 3.6 | ..... | 3.4 |
| ..... | ..... | ..... | ..... | ..... |
| $P^{TH}$ BATTERY CELL | 3.7 | 3.4 | ..... | 3.4 |
| CELL VOLTAGE DEVIATION | 0.18 | 0.3 | ..... | 0.1 |
| PACK VOLTAGE | 18.02 | 17.9 | ..... | 17.2 |
| PACK VOLTAGE DEVIATION | -0.12 |  |  | -0.7 |

FIG. 5

|  | FIRST BATTERY PACK | SECOND BATTERY PACK | ..... | $N^{TH}$ BATTERY PACK |
|---|---|---|---|---|
| PACK BALANCING | NO | NO | ..... | NO |
| CELL BALANCING | NO | YES | ..... | NO |
| FIRST BATTERY CELL | 3.6 | 3.55 | ..... | 3.5 |
| SECOND BATTERY CELL | 3.57 | 3.5 | ..... | 3.45 |
| THIRD BATTERY CELL | 3.55 | 3.45 | ..... | 3.45 |
| FOURTH BATTERY CELL | 3.52 | 3.45 | ..... | 3.4 |
| ..... | ..... | ..... | ..... | ..... |
| $P^{TH}$ BATTERY CELL | 3.6 | 3.4 | ..... | 3.4 |
| CELL VOLTAGE DEVIATION | 0.08 | 0.15 | ..... | 0.1 |
| PACK VOLTAGE | 17.84 | 17.35 | ..... | 17.2 |
| PACK VOLTAGE DEVIATION | -0.49 |  |  | -0.15 |

FIG. 6

|  | FIRST BATTERY PACK | SECOND BATTERY PACK | ..... | $N^{TH}$ BATTERY PACK |
|---|---|---|---|---|
| PACK BALANCING | NO | NO | ..... | NO |
| CELL BALANCING | NO | NO | ..... | NO |
| FIRST BATTERY CELL | 3.6 | 3.45 | ..... | 3.5 |
| SECOND BATTERY CELL | 3.57 | 3.47 | ..... | 3.45 |
| THIRD BATTERY CELL | 3.55 | 3.45 | ..... | 3.45 |
| FOURTH BATTERY CELL | 3.52 | 3.45 | ..... | 3.4 |
| ..... | ..... | ..... | ..... | ..... |
| $P^{TH}$ BATTERY CELL | 3.6 | 3.4 | ..... | 3.4 |
| CELL VOLTAGE DEVIATION | 0.08 | 0.07 | ..... | 0.1 |
| PACK VOLTAGE | 17.84 | 17.22 | ..... | 17.2 |
| PACK VOLTAGE DEVIATION | -0.62 |  |  | -0.02 |

APPARATUS AND METHOD FOR BALANCING BATTERY PACKS CONNECTED IN PARALLEL

TECHNICAL FIELD

The present disclosure relates to an apparatus and method for balancing battery packs, and more particularly, to an apparatus and method for balancing a plurality of battery packs connected in parallel.

The present application claims priority to Korean Patent Application No. 10-2019-0131694 filed on Oct. 22, 2019 and Korean Patent Application No. 10-2020-0136984 filed on Oct. 21, 2020 in the Republic of Korea, the disclosures of which are incorporated herein by reference.

BACKGROUND ART

The application field of batteries is gradually increasing not only to mobile devices such as cellular phones, laptop computers, smart phones and smart pads, but also electric-driven vehicles (EVs, HEVs, PHEVs), large-capacity energy storage systems (ESS), or the like.

A battery system mounted to an electric vehicle includes a plurality of battery packs connected in parallel to secure a high energy capacity, and each battery pack includes a plurality of battery cells connected in series.

In this specification, the battery cell may include one unit cell or a plurality of unit cells connected in parallel. The unit cell refers to one independent cell that has a negative electrode terminal and a positive electrode terminal and is physically separable. For example, one pouch-type lithium polymer cell may be regarded as a unit cell.

The plurality of battery cells included in the battery pack do not have the same electrochemical characteristics. In addition, as the number of charging/discharging cycles increases, the rate of degradation varies for each battery cell, so the performance deviation of the battery cells becomes greater.

In general, the higher the degree of degradation of the battery cell, the higher the voltage change rate. Thus, while a plurality of battery cells are being charged or discharged, the voltages of the battery cells represent a deviation.

When a battery system is charged or discharged, if a voltage deviation occurs between battery cells, a pack voltage deviation also occurs between battery packs. This is because the voltages of the battery cells included in each battery pack are not the same. Here, the pack voltage corresponds to the sum of voltages of the battery cells connected in series and included in the battery pack.

If a pack voltage deviation occurs between battery packs, an in-rush current flows between the battery packs for a short period of time when charging or discharging of the battery system starts.

The in-rush current flows from a high-voltage battery pack to a low-voltage battery pack. The in-rush current damages electrical components, for example a relay switch, included in a load device to which the battery system is mounted, and damages the battery cells included in the battery pack through which the in-rush current flows.

The conventional balancing strategies have focused on eliminating the voltage deviation of the battery cells connected in series. However, in a battery system including battery packs connected in parallel, if only the battery cells included in the battery pack are balanced, the pack voltage deviation increases, which makes the in-rush current problem more serious.

Therefore, for the battery packs connected in parallel, it is necessary to effectively prevent a problem that may arise from an in-rush current by not only balancing the battery cells included in the battery pack but also balancing the battery packs with each other at an appropriate time.

DISCLOSURE

Technical Problem

The present disclosure is designed to solve the problems of the related art, and therefore the present disclosure is directed to providing an apparatus and method for balancing a plurality of battery packs connected in parallel, which may effectively perform voltage balancing to battery packs or to battery cells included in each battery pack in a battery system that includes battery packs connected in parallel.

Technical Solution

In one aspect of the present disclosure, there is provided an apparatus for balancing battery packs connected in parallel, which is capable of complementarily performing pack balancing and cell balancing, the apparatus comprising: first to $n^{th}$ battery packs connected in parallel with each other and respectively including a plurality of battery cells connected in series; a voltage measurer configured to measure voltages of the plurality of battery cells included in each battery pack; a plurality of discharge circuits connected in parallel to correspond to the plurality of battery cells; and a processor operatively connected to the voltage measurer and the plurality of discharge circuits.

Preferably, the processor may be configured to: measure voltages of all battery cells included in each battery pack at a predetermined time interval by means of the voltage measurer, determine a pack voltage of each battery pack from the measured voltages of the battery cells, and determine a pack voltage deviation and a cell voltage deviation of each battery pack; when the pack voltage deviation is greater than a first threshold value, determine a cell voltage corresponding to a preset criterion among the voltages of all cells included in the first to $n^{th}$ battery packs as a pack balancing target voltage, identify a battery cell having a higher voltage than the pack balancing target voltage among the battery cells included in each battery pack, and operate a discharge circuit connected to the identified battery cell to reduce the pack voltage deviation to the first threshold value or below; and when the pack voltage deviation is equal to or smaller than the first threshold value, identify a battery pack having a cell voltage deviation greater than a second threshold value among the first to $n^{th}$ battery packs, determine a cell voltage corresponding to a preset criterion among the voltages of the battery cells included in the identified battery pack as a cell balancing target voltage for the identified battery pack, and operate a discharge circuit connected to a battery cell having a higher voltage than the cell balancing target voltage among the battery cells included in the identified battery pack to reduce the cell voltage deviation to the second threshold value or below.

According to an embodiment, each discharge circuit may include a switch and a resistor.

According to another embodiment, the processor may be configured to stop pack balancing and cell balancing when the pack voltage deviation is equal to or smaller than the first threshold value and the cell voltage deviation of each battery pack is equal to or smaller than the second threshold value.

According to still another embodiment, the processor may be configured to reduce the first threshold value and the second threshold value as the number of charging/discharging cycles of the battery packs connected in parallel increases.

According to still another embodiment, the balancing apparatus according to the present disclosure may further comprise a current measuring unit configured to measure an in-rush current flowing into each battery pack, and the processor may be configured to determine a maximum value of the in-rush current by measuring the in-rush current flowing into each battery pack by means of the current measurer, and reduce the first threshold value and the second threshold value according to a level of the maximum value of the in-rush current.

Preferably, when the pack voltage deviation is greater than the first threshold value, the processor may be configured to determine a lowest cell voltage among the voltages of all cells included in the first to $n^{th}$ battery packs or an average cell voltage of the voltages of all cells as the pack balancing target voltage.

Preferably, when the pack voltage deviation is equal to or smaller than the first threshold value, the processor may be configured to identify a battery pack having a cell voltage deviation greater than the second threshold value, and determine a lowest cell voltage among the voltages of the battery cells included in the identified battery pack or an average cell voltage thereof as the cell balancing target voltage for the identified battery pack.

In another aspect of the present disclosure, there is also provide a battery management system or an electric driving mechanism, comprising the apparatus for balancing battery packs connected in parallel as described above.

In another aspect of the present disclosure, there is also provide a method for balancing battery packs connected in parallel, comprising: (a) by a voltage measurer, measuring voltages of all battery cells included in a plurality of battery packs at a predetermined time interval; (b) determining a pack voltage of each battery pack from the measured voltages of the battery cells; (c) determining a pack voltage deviation and a cell voltage deviation of each battery pack; (d) when the pack voltage deviation is greater than a first threshold value, determining a cell voltage corresponding to a preset criterion among the voltages of all cells included in the plurality of battery packs as a pack balancing target voltage, identifying a battery cell having a higher voltage than the pack balancing target voltage among the battery cells included in each battery pack, and operating a discharge circuit connected to the identified battery cell to reduce the pack voltage deviation to the first threshold value or below; and (e) when the pack voltage deviation is equal to or smaller than the first threshold value, identifying a battery pack having a cell voltage deviation greater than a second threshold value among the first to $n^{th}$ battery packs, determining a cell voltage corresponding to a preset criterion among the voltages of the battery cells included in the identified battery pack as a cell balancing target voltage for the identified battery pack, and operating a discharge circuit connected to a battery cell having a higher voltage than the cell balancing target voltage among the battery cells included in the identified battery pack to reduce the cell voltage deviation to the second threshold value or below.

According to an embodiment, the balancing method according to the present disclosure may further comprise: stopping the operation for pack balancing and cell balancing when the pack voltage deviation is equal to or smaller than the first threshold value and the cell voltage deviation of each battery pack is equal to or smaller than the second threshold value.

According to another embodiment, the balancing method according to the present disclosure may further comprise: reducing the first threshold value and the second threshold value as the number of charging/discharging cycles of the battery packs connected in parallel increases.

According to still another embodiment, the balancing method according to the present disclosure may further comprise: by a current measurer, measuring an in-rush current flowing into each battery pack; and determining a maximum value of the in-rush current and reducing the first threshold value and the second threshold value according to a level of the maximum value of the in-rush current.

Preferably, in the step (d), when the pack voltage deviation is greater than the first threshold value, a lowest cell voltage among the voltages of all cells included in the plurality of battery packs or an average cell voltage of the voltages of all cells may be determined as the pack balancing target voltage.

Preferably, in the step (e), when the pack voltage deviation is equal to or smaller than the first threshold value, a battery pack having a cell voltage deviation greater than the second threshold value may be identified, and a lowest cell voltage among the voltages of the battery cells included in the identified battery pack or an average cell voltage thereof may be determined as the cell balancing target voltage for the identified battery pack.

Advantageous Effects

According to an embodiment of the present disclosure, it is possible to prevent electric components (for example, relay switches) or battery cells from being damaged due to an in-rush current by reducing a voltage difference between battery packs in a battery system that includes battery packs connected in parallel.

According to another embodiment of the present disclosure, the pack voltage deviation may be kept to a minimum by complementary use of pack balancing between battery packs and cell balancing inside the battery pack.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIGS. 3 to 6 are tables for specifically illustrating a process in which pack balancing and cell balancing are complementarily used when the balancing method according to an embodiment of the present disclosure is applied.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

In the embodiments described below, a battery cell refers to a lithium secondary battery. Here, the lithium secondary battery collectively refers to a secondary battery in which lithium ions act as operating ions during charging and discharging to cause an electrochemical reaction at a positive electrode and a negative electrode.

Meanwhile, even if the name of the secondary battery changes depending on the type of electrolyte or separator used in the lithium secondary battery, the type of packaging material used to package the secondary battery, and the interior or exterior structure of the lithium secondary battery, as long as lithium ions are used as operating ions the secondary battery should be interpreted as being included in the category of the lithium secondary battery.

The present disclosure may also be applied to other secondary batteries other than the lithium secondary battery. Therefore, even if the operating ions are not lithium ions, any secondary battery to which the technical idea of the present disclosure may be applied should be interpreted as being included in the category of the present disclosure regardless of its type.

In addition, it should be noted in advance that the battery cell may refer to one unit cell or a plurality of unit cells connected in parallel.

Figure 1:
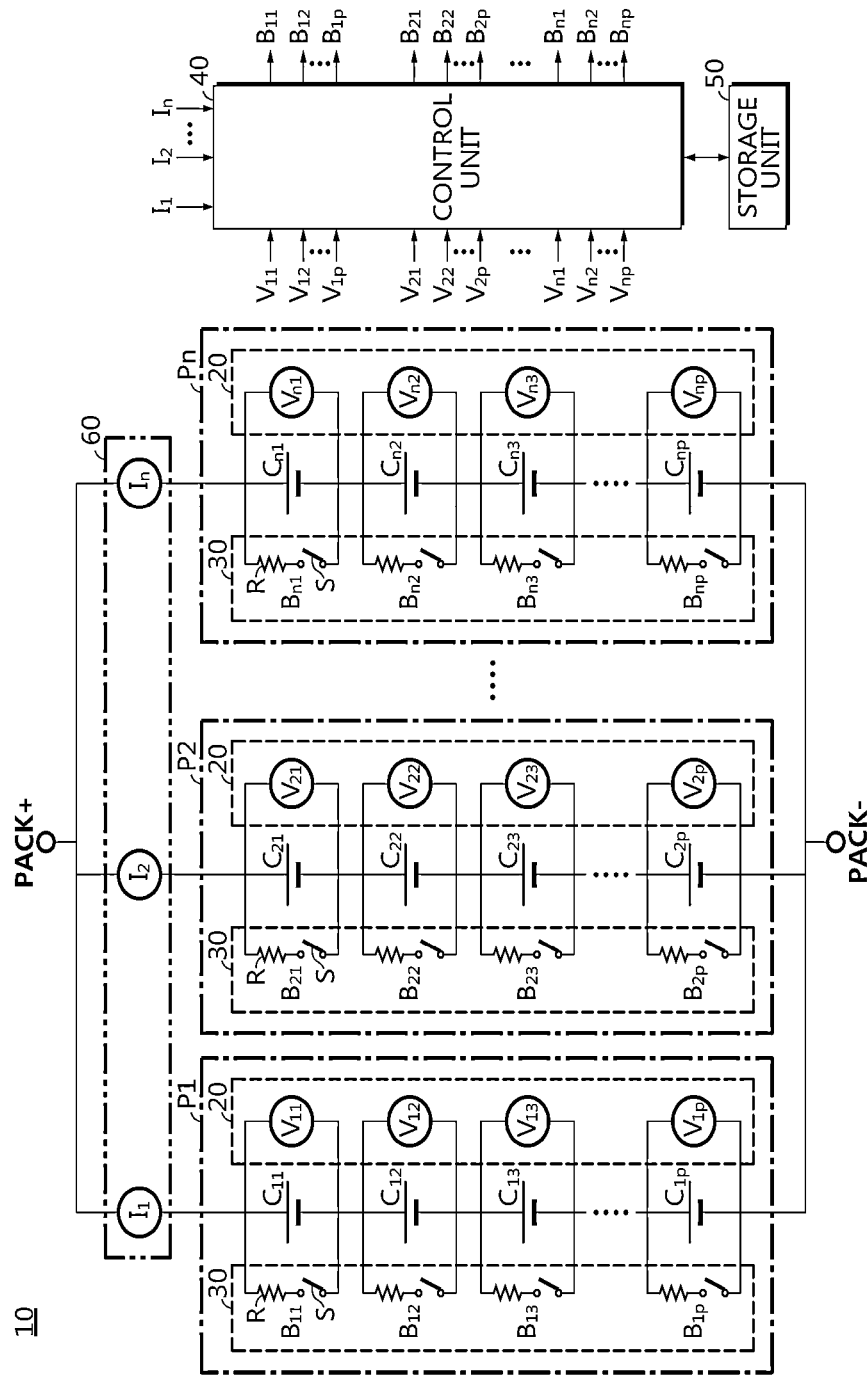
FIG. 1 is a block diagram showing an apparatus for balancing battery packs connected in parallel (hereinafter, also referred to as a "balancing apparatus") according to an embodiment of the present disclosure.

FIG. 1 is a block diagram showing an apparatus for balancing battery packs connected in parallel (hereinafter, also referred to as a "balancing apparatus") according to an embodiment of the present disclosure.

Referring to FIG. 1, a balancing apparatus 10 according to an embodiment of the present disclosure is a device that may be coupled to first to $n^{th}$ battery packs P1, P2, . . . , Pn connected in parallel to complementarily perform pack balancing and cell balancing for the first to $n^{th}$ battery packs P1, P2, . . . , Pn.

Each of the first to $n^{th}$ battery packs P1, P2, . . . , Pn includes a plurality of battery cells connected in series therein. That is, the first battery pack P1 includes first to $p^{th}$ battery cells $C_{11}$ to $C_{1p}$ connected in series. In addition, the second battery pack P2 includes first to $p^{th}$ battery cells $C_{21}$ to $C_{2p}$ connected in series. In addition, the $n^{th}$ battery pack Pn includes first to $p^{th}$ battery cells $C_{n1}$ to $C_{np}$ connected in series. Though not shown in the drawing, each of the third to n−1$^{th}$ battery packs includes the p number of battery cells connected in series in the same manner as the illustrated battery packs.

In the present disclosure, the pack balancing refers to balancing performed when a voltage deviation among the first to $n^{th}$ battery packs P1, P2, . . . , Pn is greater than a first threshold value. In addition, the cell balancing refers to balancing performed when a voltage deviation among the battery cells included in the battery pack is greater than a second threshold value. In an example, balancing means consuming energy stored in a battery cell through discharge.

The balancing apparatus 10 according to the present disclosure includes a voltage measuring unit 20 for measuring voltages of a plurality of battery cells included in each battery pack. The voltage measuring unit 20 includes a plurality of voltage measuring circuits installed inside the battery pack to measure a voltage of each battery cell. That is, the first battery pack P1 includes first to $p^{th}$ voltage measuring circuits $V_{11}$ to $V_{1p}$. In addition, the second battery pack P2 includes first to $p^{th}$ voltage measuring circuits $V_{21}$ to $V_{2p}$. In addition, the $n^{th}$ battery pack Pn includes first to $p^{th}$ voltage measuring circuits $V_{n1}$ to $V_{np}$. Although third to n−1$^{th}$ battery packs are not illustrated, each of the third to n−1th battery packs includes the p number of voltage measuring circuits in the same way as the illustrated battery packs.

The first to $p^{th}$ voltage measuring circuits $V_{11}$ to $V_{1p}$ included in the first battery pack P1 are electrically coupled with the control unit 40 to send and receive electric signals. In addition, the first to $p^{th}$ voltage measuring circuits $V_{11}$ to $V_{1p}$ measure voltages applied between positive electrodes and negative electrodes of the first to $p^{th}$ battery cells $C_{11}$, $C_{12}$, $C_{13}$, . . . , $C_{1p}$ at a time interval under the control of the control unit 40 and output a signal indicating the magnitude of the measured voltage to the control unit 40. The control unit 40 determines the voltage of each battery cell $C_{11}$, $C_{12}$, $C_{13}$, . . . , $C_{1p}$ from the signal output from the first to $p^{th}$ voltage measuring circuits $V_{11}$ to $V_{1p}$ and stores the determined voltage value in a storage unit 50.

Similarly, the first to $p^{th}$ voltage measuring circuits $V_{21}$ to $V_{2p}$ included in the second battery pack P2 are electrically coupled with the control unit 40 to send and receive electric signals. In addition, the first to $p^{th}$ voltage measuring circuits $V_{21}$ to $V_{2p}$ measure voltages applied between positive electrodes and negative electrodes of the first to $p^{th}$ battery cells $C_{21}$, $C_{22}$, $C_{23}$, . . . , $C_{2p}$ at a time interval under the control of the control unit 40 and output a signal indicating the magnitude of the measured voltage to the control unit 40. The control unit 40 determines the voltage of each battery cell $C_{21}$, $C_{22}$, $C_{23}$, . . . , $C_{2p}$ from the signal output from the first to $p^{th}$ voltage measuring circuits $V_{21}$ to $V_{2p}$ and stores the determined voltage value in the storage unit 50.

Similarly, the first to $p^{th}$ voltage measuring circuits $V_{n1}$ to $V_{np}$ included in the $n^{th}$ battery pack Pn are electrically coupled with the control unit 40 to send and receive electric signals. Also, the first to $p^{th}$ voltage measuring circuits $V_{n1}$ to $V_{np}$ measure voltages applied between positive electrodes and negative electrodes of the first to $p^{th}$ battery cells $C_{n1}$, $C_{n2}$, $C_{n3}$, . . . , $C_{np}$ at a time interval under the control of the control unit 40 and output a signal indicating the magnitude of the measured voltage to the control unit 40. The control unit 40 determines the voltage of each battery cell $C_{n1}$, $C_{n2}$, $C_{n3}$, . . . , $C_{np}$ from the signal output from the first to $p^{th}$ voltage measuring circuits $V_{n1}$ to $V_{np}$ and stores the determined voltage value in the storage unit 50.

Each voltage measuring circuit of the voltage measuring unit 20 includes a voltage measuring circuit commonly used in the art, for example a differential amplifier. The configuration of the voltage measuring circuit is obvious to those skilled in the art and thus will not be described in detail here.

There is no particular limitation on the type of the storage unit 50 as long as it is a storage medium capable of recording and erasing information. As an example, the storage unit 50 may be a RAM, a ROM, an EEPROM, a register, or a flash memory. The storage unit 50 may also be electrically connected to the control unit 40 through, for example, a data bus so as to be accessed by the control unit 40.

The storage unit 50 also stores and/or updates and/or erases and/or transmits a program including various control logics performed by the control unit 40, and/or data generated when the control logic is executed. The storage unit 50 may be logically divided into two or more parts and may be included in the control unit 40 without limitation.

The balancing apparatus 10 according to the present disclosure includes a balancing unit 30 installed in the first to $n^{th}$ battery packs P1 to Pn. The balancing unit 30 includes a plurality of discharge circuits installed inside the battery packs and capable of discharging each battery cell during pack balancing or cell balancing performed complementarily. That is, the first battery pack P1 includes first to $p^{th}$ discharge circuits $B_{11}$ to $B_{1n}$. In addition, the second battery pack P2 includes first to $p^{th}$ discharge circuits $B_{21}$ to $B_{2p}$. In addition, the $n^{th}$ battery pack Pn includes first to $p^{th}$ discharge circuits $B_{n1}$ to $B_{np}$. Although the third to n−1$^{th}$ battery packs are not illustrated, each of the third to n−1th battery packs includes the p number of discharge circuits in the same way as the illustrated battery packs.

The first to $p^{th}$ discharge circuits $B_{11}$ to $B_{1n}$ included in the first battery pack P1 are electrically coupled with the control unit 40 to send and receive electric signals. In addition, each of the first to $p^{th}$ discharge circuits $B_{11}$ to $B_{1p}$ discharges the battery cell connected thereto under the control of the control unit 40. To this end, each of the first to $p^{th}$ discharge circuits $B_{11}$ to $B_{1p}$ includes a resistor R and a switch S. The control unit 40 applies a turn-on signal or a turn-off signal to the switch S. If the turn-on signal is applied to the switch S, the discharge circuit starts operation, and if the turn-off signal is applied to the switch S, the discharge circuit stops operation.

Similarly, the first to $p^{th}$ discharge circuits $B_{21}$ to $B_{2p}$ included in the second battery pack P2 are electrically coupled with the control unit 40 to send and receive electric signals. In addition, each of the first to $p^{th}$ discharge circuits $B_{21}$ to $B_{2p}$ discharges the battery cell connected thereto under the control of the control unit 40. To this end, each of the first to $p^{th}$ discharge circuits $B_{21}$ to $B_{2p}$ includes a resistor R and a switch S. The control unit 40 applies a turn-on signal or a turn-off signal to the switch S. If the turn-on signal is applied to the switch S, the discharge circuit starts operation, and if the turn-off signal is applied to the switch S, the discharge circuit stops operation.

Similarly, the first to $p^{th}$ discharge circuits $B_{n1}$ to $B_{np}$ included in the $n^{th}$ battery pack Pn are electrically coupled with the control unit 40 to send and receive electric signals. In addition, each of the first to $p^{th}$ discharge circuits $B_{n1}$ to $B_{np}$ discharges the battery cell connected thereto under the control of the control unit 40. To this end, each of the first to $p^{th}$ discharge circuits $B_{n1}$ to $B_{np}$ includes a resistor R and a switch S. The control unit 40 applies a turn-on signal or a turn-off signal to the switch S. If the turn-on signal is applied to the switch S, the discharge circuit starts operation, and if the turn-off signal is applied to the switch S, the discharge circuit stops operation.

According to an embodiment, the balancing apparatus 10 according to the present disclosure includes the control unit 40. The control unit 40 controls the first to $p^{th}$ voltage measuring circuits $V_{11}$ to $V_{1p}$ of the first battery pack P1, the first to $p^{th}$ voltage measuring circuits $V_{21}$ to $V_{2p}$ of the second battery pack P2 and the first to $p^{th}$ voltage measuring circuits $V_{n1}$ to $V_{np}$ of the $n^{th}$ battery pack Pn at a certain time interval to receive the voltage measurement signals of battery cells from each voltage measuring circuit, and records the voltage values of all battery cells in the storage unit 50. The operation of the control unit 40 may be applied identically to the third to n−1$^{th}$ battery packs.

The control unit 40 also determines pack voltages of the first to $n^{th}$ battery packs P1 to Pn from the measured voltages of the battery cells and records the same in the storage unit 50. That is, the control unit 40 determines a pack voltage of the first battery pack P1 by summing the voltage values of the first to $p^{th}$ battery cells $C_{11}$ to $C_{1p}$ included in the first battery pack P1 and records the same in the storage unit 50. In addition, the control unit 40 determines a pack voltage of the second battery pack P2 by summing the voltage values of the first to $p^{th}$ battery cells $C_{21}$ to $C_{2p}$ included in the second battery pack P2 and records the same in the storage unit 50. In addition, control unit 40 determines a pack voltage of the $n^{th}$ battery pack Pn by summing the voltage values of the first to $p^{th}$ battery cells $C_{n1}$ to $C_{np}$ included in $n^{th}$ battery pack Pn and records the same in the storage unit 50. The operation of the control unit 40 may be applied identically to the third to n−1$^{th}$ battery packs.

The control unit 40 also determines a pack voltage deviation and a cell voltage deviation of the first to $n^{th}$ battery packs P1 to Pn using the voltage information of the battery cells recorded in the storage unit 50 and records the same in the storage unit 50. That is, the control unit 40 determines a difference between a maximum value and a minimum value among the pack voltages of the first to $n^{th}$ battery packs P1 to Pn recorded in the storage unit 50 as a pack voltage deviation and records the same in the storage unit 50. In addition, the control unit 40 determines a difference between a maximum value and a minimum value among the voltages of the first to $p^{th}$ battery cells $C_{11}$ to $C_{1p}$ recorded in the storage unit 50 as a cell voltage deviation of the first battery pack P1 and records the same in the storage unit 50. In addition, the control unit 40 determines a difference between a maximum value and a minimum value among the voltages of the first to $p^{th}$ battery cells $C_{21}$ to $C_{2p}$ recorded in the storage unit 50 as a cell voltage deviation of the second battery pack P2 and records the same in the storage unit 50. In addition, the control unit 40 determines a difference between a maximum value and a minimum value among the voltages of the first to $p^{th}$ battery cells $C_{n1}$ to $C_{np}$ recorded in the storage unit 50 as a cell voltage deviation of the $n^{th}$ battery pack Pn and records the same in the storage unit 50. The operation of the control unit 40 may be applied identically to the third to n−1$^{th}$ battery packs.

If the pack voltage deviation of the first to $n^{th}$ battery packs P1 to Pn is greater than the first threshold value, the control unit 40 determines a cell voltage corresponding to a preset criterion among the voltages of all cells included in the first to $n^{th}$ battery packs P1 to Pn as a pack balancing target voltage.

As a non-limiting example, the cell voltage corresponding to the preset criterion may be a lowest cell voltage among all cell voltages or an average voltage of all cell voltages. The first threshold value is set as a value optimized to achieve the object of the present disclosure and is recorded in advance in the storage unit 50. In an example, the first threshold value may have a value between 1.2V and 1.5V, but the present disclosure is not limited thereto. In addition, the control unit 40 identifies a battery cell(s) having a higher voltage than the pack balancing target voltage among the battery cells included in the first to $n^{th}$ battery packs P1 to Pn and applies a turn-on signal to the switch S included in the discharge circuit connected to the identified battery cell(s) to operate the corresponding discharge circuit, thereby starting the pack balancing operation.

After the pack balancing operation is started, the control unit 40 also measures the voltages applied between the positive electrodes and the negative electrodes of the first to $p^{th}$ battery cells $C_{11}, C_{12}, C_{13}, \ldots, C_{1p}$ by using the first to $p^{th}$ voltage measuring circuits $V_{11}$ to $V_{1p}$ of the first battery pack P1 at a time interval as described above, and record the same in the storage unit 50. The voltage measurement and storage operation of the control unit 40 is applied identically to the second to $n^{th}$ battery packs P2 to Pn.

The control unit 40 also determines the pack voltages of the first to $n^{th}$ battery packs P1 to Pn based on the voltage information of the battery cells recorded in the storage unit 50 whenever the voltages of the battery cells are measured while pack balancing is being performed, determines a pack voltage deviation based on the pack voltage information, and monitors the magnitude of the pack voltage deviation.

If the monitored pack voltage deviation becomes equal to or smaller than the first threshold value, the control unit 40 also identifies the discharge circuit to which the turn-on signal was applied to stop pack balancing, and applies a turn-off signal to the switch included in the identified discharge circuit to stop the operation of the identified discharge circuit. By doing so, the pack balancing mode is stopped.

After the pack balancing mode is stopped, the control unit 40 also measures the voltages applied between the positive electrodes and negative electrodes of the first to $p^{th}$ battery cells $C_{11}, C_{12}, C_{13}, \ldots, C_{1p}$ by using the first to $p^{th}$ voltage measuring circuits $V_{11}$ to $V_{1p}$ of the first battery pack P1 at a time interval as described above again and record the same in the storage unit 50. The operation of the control unit 40 is identically applied to the second to $n^{th}$ battery packs P2 to Pn.

The control unit 40 also determines the difference between the maximum value and the minimum value among the voltages of the first to $p^{th}$ battery cells $C_{11}$ to $C_{1p}$ recorded in the storage unit 50 as a cell voltage deviation of the first battery pack P1 and records the same in the storage unit 50. In addition, control unit 40 determines the difference between the maximum value and the minimum value among the voltages of the first to $p^{th}$ battery cells $C_{21}$ to $C_{2p}$ recorded in the storage unit 50 as a cell voltage deviation of the second battery pack P2 and records the same in the storage unit 50. In addition, the control unit 40 determines the difference between the maximum value and the minimum value among the voltages of the first to $p^{th}$ battery cells $C_{n1}$ to $C_{np}$ recorded in the storage unit 50 as a cell voltage deviation of the $n^{th}$ battery pack Pn and records the same in the storage unit 50. The operation of the control unit 40 may be applied identically to the third to $n-1^{th}$ battery packs.

The control unit 40 also identifies a battery pack having a cell voltage deviation greater than the second threshold value by referring to the cell voltage deviation of the first to $n^{th}$ battery packs P1 to Pn recorded in the storage unit 50. The number of identified battery packs may be one or more, and the second threshold value is set as an optimized value and recorded in advance in the storage unit 50. The second threshold value has a smaller size than the first threshold value, and may have a value between 0.1V and 0.5V, for example, but the present disclosure is not limited thereto.

The control unit 40 also determines the cell voltage corresponding to the preset criterion among the voltages of the battery cells included in the identified battery pack as a cell balancing target voltage for the identified battery pack, and operates a discharge circuit connected to a battery cell having a higher voltage than the balancing target voltage among the battery cells included in the identified battery pack to start the cell balancing operation. It is preferable that the above operation of the control unit 40 is independently applied for each battery pack identified as having a cell voltage deviation greater than the second threshold value. As a non-limiting example, the cell voltage corresponding to the preset criterion may be a lowest cell voltage among the voltages of the battery cells included in the identified battery pack or an average cell voltage thereof.

After the cell balancing operation is started, the control unit 40 also measures the voltages applied between the positive electrodes and the negative electrodes of the first to $p^{th}$ battery cells $C_{11}, C_{12}, C_{13}, \ldots, C_{1p}$ by using the first to $p^{th}$ voltage measuring circuits $V_{11}$ to $V_{1p}$ of the first battery pack P1 at a time interval as described above and record the same in the storage unit 50. The voltage measurement and storage operation of the control unit 40 is applied identically to the second to $n^{th}$ battery packs P2 to Pn.

The control unit 40 also calculates a cell voltage deviation for the battery pack to which cell balancing is performed, based on the voltage information of the battery cells recorded in the storage unit 50 whenever the voltages of the battery cells are measured while cell balancing is being performed, and monitors its magnitude.

If the cell voltage deviation being monitored becomes equal to or smaller than the second threshold value, the control unit 40 also identifies a battery pack that satisfies the corresponding condition, identifies a discharge circuit to which the turn-on signal has been applied among the discharge circuits included in the identified battery pack in order to stop cell balancing, and applies a turn-off signal to the switch included in the identified discharge circuit to stop the operation of the identified discharge circuit. As a result, the cell balancing mode for the battery pack having a cell voltage deviation reduced to the second threshold value or below is stopped. Of course, the control unit 40 maintains the cell balancing mode for a battery pack having a cell voltage deviation greater than the second threshold value. In addition, the control unit 40 may repeat the operation of monitoring the cell voltage deviation and maintaining or stopping the cell balancing mode based on the result, while the battery pack having a cell voltage deviation greater than the second threshold value is identified.

The control unit 40 may maintain the pack voltage deviation between the first to $n^{th}$ battery packs P1 to Pn to be equal to or smaller than the first threshold value and at the same time maintain the cell voltage deviation of each of the first to $n^{th}$ battery packs P1 to Pn to be equal to or smaller than the second threshold value by complementarily performing pack balancing and cell balancing as above.

The control unit 40 may periodically execute a balancing mode including pack balancing and cell balancing. In addition, the control unit 40 may stop charging or discharging the battery system including the first to $n^{th}$ battery packs P1 to Pn while the balancing mode is in progress. In addition, while periodically measuring the voltages of all battery cells included in the first to $n^{th}$ battery packs P1 to Pn while charging or discharging the battery system, the control unit 40 may stop charging or discharging of the battery system and perform pack balancing and cell balancing whenever a pack balancing start condition is satisfied. In addition, if a stop condition for pack balancing and cell balancing is satisfied, the control unit 40 may start charging or discharging the battery system again. In addition, when the battery system is in a no-load state, the control unit 40 may measure the voltages of all battery cells included in the first to $n^{th}$ battery packs P1 to Pn after the no-load state has elapsed for a predetermined time, and perform pack balancing and cell balancing if the pack balancing start condition is satisfied.

It is obvious that the control unit 40 stops pack balancing and cell balancing if the pack voltage deviation is equal to or smaller than the first threshold value and the cell voltage deviation of each battery pack is equal to or smaller than the second threshold value.

According to another embodiment, the control unit 40 may be configured to count the number of charging/discharging cycles of the battery system including the first to $n^{th}$ battery packs P1 to Pn connected in parallel, record the same in the storage unit 50, and decrease the first threshold value and the second threshold value as the number of charging/discharging cycles increases. If the number of charging/discharging cycles increases, the first to $n^{th}$ battery packs P1 to Pn are degraded and thus the difference in performance increases between the battery packs. Therefore, it is desirable to alleviate the starting condition for pack balancing or cell balancing by reducing the first threshold value and the second threshold value.

The number of charging/discharging cycles refers to the cumulative number of times that the battery system is charged above a preset SOC (State Of Charge) and then discharged again below the preset SOC. The control unit 40 may accumulatively calculate the number of charging/discharging cycles while the battery system is being charged or discharged by monitoring the pack voltages of the first to $n^{th}$ battery packs P1 to Pn, and record the same in the storage unit 50.

According to another embodiment, the balancing apparatus 10 according to the present disclosure may further include a current measuring unit 60 for measuring the magnitude of an in-rush current flowing into the first to $n^{th}$ battery packs P1 to Pn. The current measuring unit 60 includes a first current measuring circuit $I_1$ installed at a high-potential side of the first battery pack P1 to measure the magnitude of an in-rush current flowing into the first battery pack P1, a second current measuring circuit $I_2$ installed at a high-potential side of the second battery pack P2 to measure the magnitude of an in-rush current flowing into the second battery pack P2, and an $n^{th}$ current measuring circuit $I_n$ installed at a high-potential side of the $n^{th}$ battery pack Pn to measure the magnitude of an in-rush current flowing into the $n^{th}$ battery pack Pn. In addition, although not shown, it is obvious that a current measuring circuit is also installed at a high-potential side of each of the third to n−1th battery packs to measure an in-rush current.

In the above case, the control unit 40 may be configured to measure the magnitude of the in-rush current flowing into the first to $n^{th}$ battery packs P1 to Pn using the current measuring unit 60, record the same in the storage unit 50, determines a maximum value of the in-rush current, and decrease the first threshold value and the second threshold value according to the level of the maximum value of the in-rush current.

Since the in-rush current increases as the battery pack is degraded, it is preferable to alleviate a start condition of pack balancing or cell balancing by reducing the first threshold value and the second threshold value in order to prevent the first to $n^{th}$ battery packs P1 to Pn from being damaged due to the in-rush current. To this end, a look-up table may be stored in the storage unit 50 in advance so that the first threshold value and the second threshold value according to the maximum value of the in-rush current may be referred to, and the control unit 40 may adjust the first threshold value and the second threshold value according to the maximum value of the in-rush current with reference to the look-up table.

In the present disclosure, the first to $n^{th}$ current measuring circuits $I_1$ to $I_n$ may be a Hall sensor that outputs a voltage signal corresponding to the magnitude of current. Alternatively, the first to $n^{th}$ current measuring circuits $I_1$ to $I_n$ may be a sense resistor and a sense resistor circuit that outputs a signal corresponding to the voltage applied to both ends of the sense resistor. The voltage applied to both ends of the sense resistor may be converted to the magnitude of current according to Ohm's law. Circuits for measuring current are well known in the art and thus will not be described in detail here.

In the present disclosure, the control unit 40 may optionally include a processor, an application-specific integrated circuit (ASIC), another chipset, a logic circuit, a register, a communication modem, a data processing device, or the like, known in the art to execute the various control logics described above. In addition, when the control logic is implemented in software, the control unit 40 may be implemented as a set of program modules. At this time, the program module may be stored in a memory and executed by a processor. The memory may be provided inside or outside the processor and be connected to the processor through various well-known computer components. Also, the memory may be included in the storage unit 50 of the present disclosure. In addition, the memory refers to a device in which information is stored, regardless of the type of device, and does not refer to a specific memory device.

In addition, one or more of the various control logics of the control unit 40 may be combined, and the combined control logics may be written in a computer-readable code system and recorded in a computer-readable recording medium. The recording medium is not particularly limited as long as it is accessible by a processor included in a computer. As an example, the storage medium includes at least one selected from the group consisting of a ROM, a RAM, a register, a CD-ROM, a magnetic tape, a hard disk, a floppy disk and an optical data recording device. The code scheme may be distributed to a networked computer to be stored and executed therein. In addition, functional programs, codes and code segments for implementing the combined control logics may be easily inferred by programmers in the art to which the present disclosure belongs.

Figure 7:
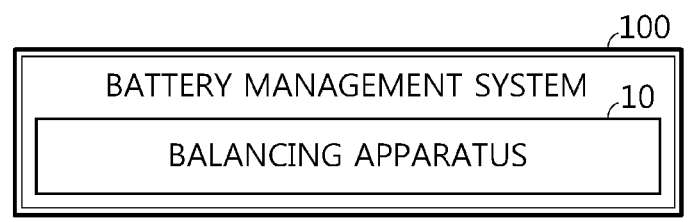
FIG. 7 is a block diagram showing a battery management system including the balancing apparatus according to an embodiment of the present disclosure.

The balancing apparatus 10 according to the present disclosure may be included in a battery management system 100 as shown in FIG. 7. The battery management system 100 controls the overall operation related to charging and discharging of a battery, and is a computing system called a battery management system (BMS) in the art.

Figure 8:
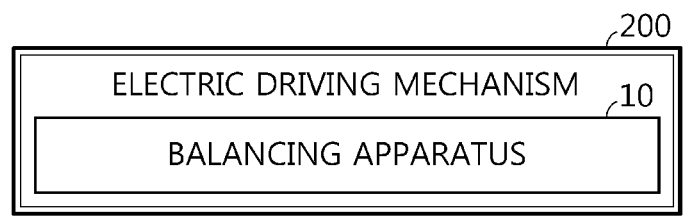
FIG. 8 is a block diagram showing an electric driving mechanism including the balancing apparatus according to an embodiment of the present disclosure.

In addition, the balancing apparatus 10 according to the present disclosure may be mounted to various types of electric driving mechanism 200 as shown in FIG. 8.

According to an embodiment, the electric driving mechanism 200 may be a mobile computer device such as a mobile phone, a laptop computer and a tablet computer, or a handheld multimedia device such as a digital camera, a video camera and an audio/video reproduction device.

According to another embodiment, the electric driving mechanism 200 may be an electric power device movable by electricity, such as an electric vehicle, a hybrid electric vehicle, an electric bicycle, an electric motorcycle, an electric train, an electric ship and an electric plane, or a power tool having a motor, such as an electric drill and an electric grinder.

Figure 2:
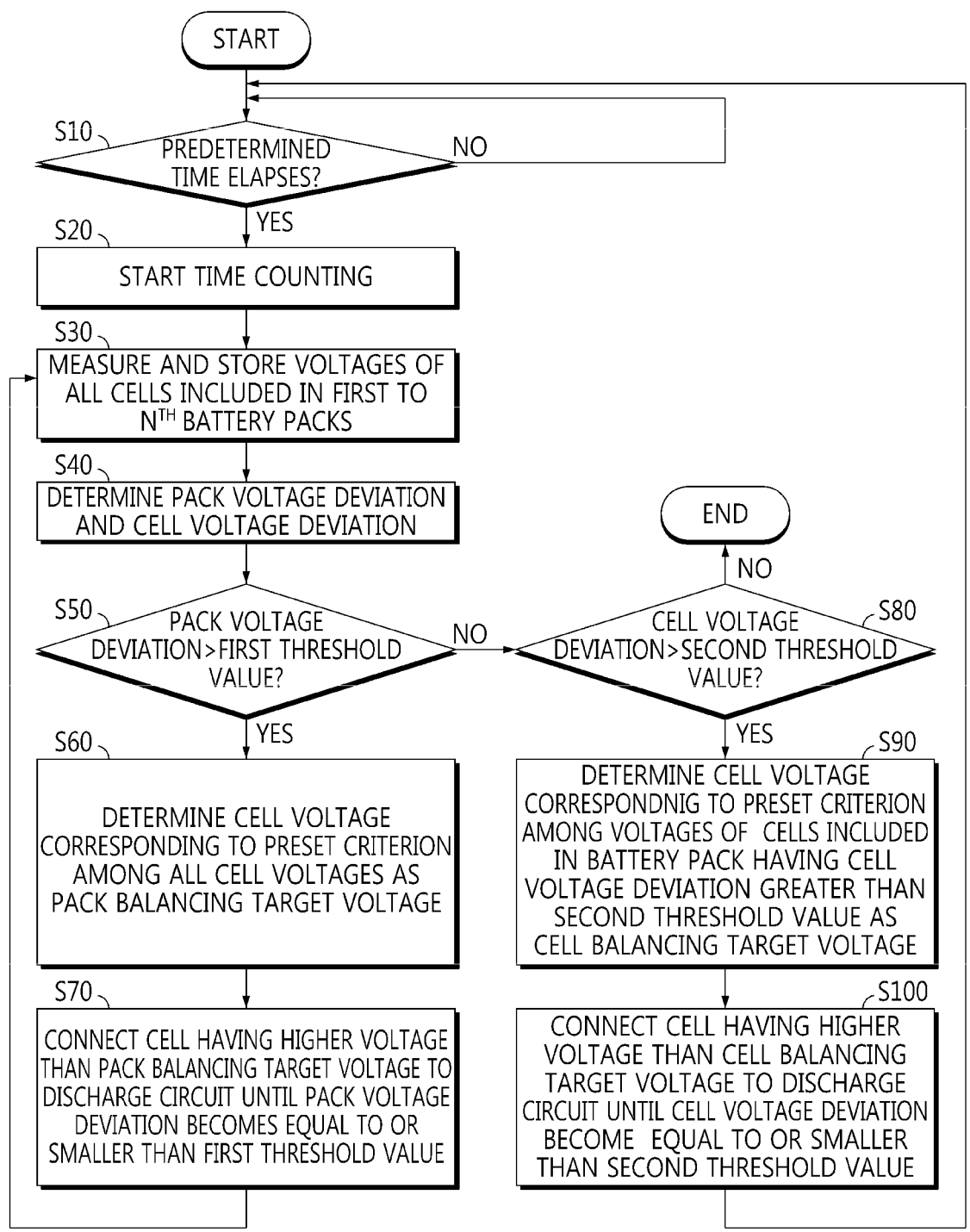
FIG. 2 is a flowchart for illustrating a method for balancing battery packs connected in parallel (hereinafter, also referred to as a "balancing method") according to an embodiment of the present disclosure.

FIG. 2 is a flowchart for illustrating a method for balancing battery packs connected in parallel (hereinafter, also referred to as a "balancing method") according to an embodiment of the present disclosure by the control unit 40.

As shown in FIG. 2, in Step S10, when a battery system including battery packs connected in parallel is being charged or discharged or when the battery system is in a no-load state, the control unit 40 determines whether a predetermined time has elapsed. The predetermined time may be 1 second to dozens of seconds, but the present disclosure is not limited thereto.

If the determination result in Step S10 is YES, the control unit 40 shifts the process to Step S20 and starts time counting. Meanwhile, if the determination result in Step S10 is NO, the control unit 40 suspends the process.

After performing Step S20, in Step S30, the control unit 40 measures voltages of all battery cells included in each battery pack using the voltage measuring unit 20 included in the first to $n^{th}$ battery packs P1 to Pn and records the same in the storage unit 50. Step S40 proceeds after Step S30.

In Step S40, the control unit 40 determines a pack voltage for each of the first to $n^{th}$ battery packs P1 to Pn by referring to the cell voltage information recorded in the storage unit 50, determines a pack voltage deviation of the first to $n^{th}$ battery packs P1 to Pn and record the same in the storage unit 50. The pack voltage of each battery pack is determined by summing the voltages of the battery cells included in the corresponding battery pack. The pack voltage deviation of the first to $n^{th}$ battery packs P1 to Pn is determined by calculating a difference between a maximum value and a minimum value of the pack voltages.

In addition, in Step S40, the control unit 40 determines a cell voltage deviation for each of the first to $n^{th}$ battery packs P1 to Pn by referring to the cell voltage information recorded in the storage unit 50 and records the same in the storage unit 50. The cell voltage deviation of each battery pack is determined by calculating a difference between a maximum value and a minimum value of the cell voltages by referring to the voltage of the battery cells included in the battery pack. Step S50 proceeds after Step S40.

In Step S50, the control unit 40 determines whether the pack voltage deviation is greater than the first threshold value. In an example, the first threshold value has a value between 1.2V and 1.5V.

If the determination result in Step S50 is YES, the control unit 40 proceeds to Step S60. That is, in Step S60, the control unit 40 determines a cell voltage corresponding to the preset criterion among the voltages of all cells included in the first to $n^{th}$ battery packs P1 to Pn as a pack balancing target voltage. As a non-limiting example, the cell voltage corresponding to the preset criterion may be a lowest cell voltage among all cell voltages or an average cell voltage of all cell voltages.

Step S70 proceeds after Step S60.

In Step S70, the control unit 40 identifies a battery cell(s) having a higher voltage than the pack balancing target voltage among the battery cells included in the first to $n^{th}$ battery packs P1 to Pn, and applies a turn-on signal to the switch S included in the discharge circuit connected to the identified battery cell(s) to operate the corresponding discharge circuit, thereby starting the pack balancing operation.

In addition, after the pack balancing operation is started, in Step S70, the control unit 40 measures voltages applied between the positive electrodes and the negative electrodes of the first to $p^{th}$ battery cells $C_{11}, C_{12}, C_{13}, \ldots, C_{1p}$ by using the first to $p^{th}$ voltage measuring circuits $V_{11}$ to $V_{1p}$ included in the first battery pack P1 at a time interval and records the same in the storage unit 50. The control unit 40 measures the voltage in the same way for the battery cells included in the second to $n^{th}$ battery packs P2 to Pn and records the same in the storage unit 50.

In addition, in Step S70, whenever the voltages of the battery cells are measured while pack balancing is being performed, the control unit 40 determines pack voltages for the first to $n^{th}$ battery packs P1 to Pn based on the voltage information of the battery cells recorded in the storage unit 50, update the pack voltage deviation based on the pack voltage information, and monitors the magnitude of the pack voltage deviation.

In addition, in Step S70, if the monitored pack voltage deviation becomes equal to or smaller than the first threshold value, the control unit 40 identifies a discharge circuit to which the turn-on signal has been applied in order to stop the pack balancing, and applies a turn-off signal to the switch S included in the identified discharge circuit to stop the operation of the identified discharge circuit. By doing so, the pack balancing mode is stopped. Step S30 proceeds after Step S70.

If the pack balancing mode is stopped, in Step S30, the control unit 40 measures the voltages of all battery cells included in each battery pack using the voltage measuring unit 20 included in the first to $n^{th}$ battery packs P1 to Pn and records the same in the storage unit 50. Step S40 proceeds after Step S30.

In Step S40, the control unit 40 determines the pack voltage for each of the first to $n^{th}$ battery packs P1 to Pn by referring to the cell voltage information recorded in the storage unit 50, determines the pack voltage deviation of the first to $n^{th}$ battery packs P1 to Pn, and record the same in the storage unit 50. The pack voltage of each battery pack is determined by summing the voltages of the battery cells included in the corresponding battery pack. The pack voltage deviation of the first to $n^{th}$ battery packs P1 to Pn is determined by calculating the difference between the maximum value and the minimum value of the pack voltages.

In addition, in Step S40, the control unit 40 determines the cell voltage deviation for each of the first to $n^{th}$ battery packs P1 to Pn by referring to the cell voltage information recorded in the storage unit 50 and records the same in the storage unit 50. The cell voltage deviation of each battery pack is determined by calculating the difference between the maximum value and the minimum value of the cell voltages by referring to the voltages of the battery cells included in the corresponding battery pack. Step S50 proceeds after Step S40.

In Step S50, the control unit 40 determines whether the pack voltage deviation is equal to or greater than the first threshold value. In an example, the first threshold value has a value between 1.2V and 1.5V. Since pack balancing has been performed previously, the pack voltage deviation is equal to or smaller than the first threshold value. Therefore, since the determination result of Step S50 is YES, the process shifts to Step S80.

In Step S80, the control unit 40 identifies a battery pack(s) having a cell voltage deviation greater than the second threshold value by referring to the cell voltage deviation of the first to $n^{th}$ battery packs Pn recorded in the storage unit 50. The number of identified battery packs may be one or more, and the second threshold value is set to an optimized value and recorded in advance in the storage unit 50. The second threshold value has a smaller magnitude than the first threshold value and may have a value between 0.1V and 0.5V, for example, but the present disclosure is not limited thereto.

If the determination result of Step S80 is YES, Step S90 proceeds, whereas if the determination result of Step S80 is NO, the balancing procedure according to the present disclosure is terminated.

If the determination result of Step S80 is YES, in Step S90, the control unit 40 determines the cell voltage corresponding to the preset criterion among the voltages of the battery cells included in the identified battery pack as the cell balancing target voltage for the identified battery pack. Preferably, the cell balancing target voltage may be independently determined for each battery pack identified as having a cell voltage deviation greater than the second threshold value. As a non-limiting example, the cell voltage corresponding to the preset criterion may be a lowest cell voltage among the voltages of the battery cells included in the identified battery pack or an average cell voltage thereof.

In addition, in Step S100, the control unit 40 starts cell balancing by operating a discharge circuit connected to the battery cell having a higher voltage than the cell balancing target voltage among the battery cells included in the identified battery pack. Preferably, the operation of the control unit 40 may be independently applied for each battery pack identified as having a cell voltage deviation greater than the second threshold value.

Also, in Step S100, after the cell balancing operation is started, as described above, the control unit 40 measures the voltages applied between the positive electrodes and the negative electrodes of the first to $p^{th}$ battery cells $C_{11}$, $C_{12}$, $C_{13}$, . . . , $C_{1p}$ by using the first to $p^{th}$ voltage measuring circuits $V_{11}$ to $V_{1p}$ of the first battery pack P1 at a time interval and record the same in the storage unit 50. The operation of the control unit 40 is also identically applied to the second to $n^{th}$ battery packs P2 to Pn.

In addition, in Step S100, whenever the voltages of the battery cells are measured while cell balancing is being performed, the control unit 40 determines the cell voltage deviation for the corresponding battery pack in which cell balancing is being performed based on the voltage information of the battery cells recorded in the storage unit 50 and monitors its size.

In addition, in Step S100, if the monitored cell voltage deviation becomes equal to or smaller than the second threshold value, the control unit 40 identifies a battery pack satisfying the corresponding condition, identifies a discharge circuit to which the turn-on signal has been applied among the discharge circuits included in the identified battery pack in order to stop cell balancing, and applies a turn-off signal to the switch included in the identified discharge circuit to stop the operation of the identified discharge circuit. As a result, the cell balancing mode for the battery pack having a cell voltage deviation lowered to the second threshold value or below is stopped. Of course, the control unit 40 continuously maintains the cell balancing mode for a battery pack having a cell voltage deviation greater than the second threshold value. In addition, the control unit 40 may repeat the operation of monitoring the cell voltage deviation and maintaining or stopping the cell balancing mode based on the result, while the battery pack having a cell voltage deviation greater than the second threshold value is identified.

If the determination result of Step 80 is NO, namely if the cell voltage deviation of the first to $n^{th}$ battery packs P1 to Pn is not greater than the second threshold value, the control unit 40 does not need to proceed with pack balancing or cell balancing, and thus the balancing process according to the present disclosure is terminated.

The control unit 40 may maintain the pack voltage deviation of the first to $n^{th}$ battery packs P1 to Pn to be equal to or smaller than the first threshold value and also maintain the cell voltage deviation of each of the first to $n^{th}$ battery packs P1 to Pn to be equal to or smaller than the second threshold value by complementarily performing pack balancing and cell balancing as above.

The control unit 40 may periodically repeat the above balancing process whenever a predetermined time elapses. Accordingly, in Step S10, the control unit 40 may determine whether a predetermined time has elapsed, and resume the operation of the balancing process according to the present disclosure if the predetermined time elapses.

The control unit 40 may also stop charging or discharging the battery system including the first to $n^{th}$ battery packs P1 to Pn while the balancing mode is in progress. In addition, while periodically measuring the voltages of all battery cells included in the first to $n^{th}$ battery packs P1 to Pn while the battery system is being charged or discharged, the control unit 40 may stop charging or discharging the battery system whenever the pack balancing start condition is satisfied, and perform pack balancing and cell balancing complementarily.

In addition, the control unit 40 may start charging or discharging the battery system again if the stop conditions for pack balancing and cell balancing are satisfied. In addition, when the battery system is in a no-load state, the control unit 40 may measure the voltages of all battery cells included in the first to $n^{th}$ battery packs P1 to Pn after the no-load state has elapsed for a predetermined time, and perform pack balancing and cell balancing if the pack balancing start condition is satisfied.

In the balancing method according to the present disclosure, the control unit 40 may count the number of charging/discharging cycles of the battery system including the first to $n^{th}$ battery packs P1 to Pn connected in parallel, record the same in the storage unit 50, and reduce the first threshold value and the second threshold value as the number of charging/discharging cycles increases.

If the number of charging/discharging cycles increases, the first to $n^{th}$ battery packs P1 to Pn are degraded and thus the difference in performance increases between the battery packs. Therefore, it is desirable to alleviate the starting condition for pack balancing or cell balancing by reducing the first threshold value and the second threshold value.

The number of charging/discharging cycles refers to the cumulative number of times that the battery system is charged above a preset SOC and then discharged again below the preset SOC. The control unit 40 may accumulatively calculate the number of charging/discharging cycles of the battery system by monitoring the pack voltages of the first to $n^{th}$ battery packs P1 to Pn, and record the same in the storage unit 50.

In the present disclosure, the control unit 40 may selectively perform the step of measuring the magnitude of the in-rush current flowing into the first to $n^{th}$ battery packs P1 to Pn using the current measuring unit 60 and recording the same in the storage unit 50. In addition, the control unit 40 may further include the step of determining a maximum value of the in-rush current by referring to the magnitude of the in-rush current recorded in the storage unit 50 and reduce the first threshold value and the second threshold value according to the maximum value level of the in-rush current.

Since the in-rush current increases as the battery pack is degraded, it is preferable to alleviate a start condition of pack balancing or cell balancing by reducing the first threshold value and the second threshold value according to the magnitude of the in-rush current in order to prevent the first to $n^{th}$ battery packs P1 to Pn from being damaged due to the in-rush current.

To this end, a look-up table may be stored in the storage unit 50 in advance so that the first threshold value and the second threshold value according to the maximum value of the in-rush current may be referred to. In this case, the control unit 40 may adaptively adjust the first threshold value and the second threshold value according to the maximum value of the in-rush current with reference to the look-up table.

FIGS. 3 to 6 are tables for specifically illustrating the change of voltages of the cells included in the first to $n^{th}$ battery packs P1 to Pn when pack balancing and cell balancing are complementarily performed according to an embodiment of the present disclosure.

In the embodiment described below, the first threshold value and the second threshold value are set to 1.2V and 0.1V, respectively. Also, the pack balancing target voltage is set to a lowest cell voltage among the voltages of the cells included in the entire pack. In addition, the cell balancing target voltage is set to a lowest cell voltage among the voltages of the cells included in the corresponding battery pack in which cell balancing is performed.

Referring to FIG. 3, the pack voltage of the first battery pack is 18.37V, the pack voltage of the second battery pack is 19.1V, and the pack voltage of the $n^{th}$ battery pack is 17.4V. Since the pack voltage of the second battery pack is highest and the pack voltage of the $n^{th}$ battery pack is lowest, the pack voltage deviation is 1.7V, which is greater than the first threshold value. Thus, pack voltage balancing is initiated. The pack balancing target voltage is set as a lowest voltage among the voltages of all cells. In other words, the voltage 3.4V of the $p^{th}$ battery cell of the $n^{th}$ battery pack is set as the pack balancing target voltage. In addition, pack balancing that discharges battery cells having a voltage greater than 3.4V is started. Thus, the first battery pack, the second battery pack and the $n^{th}$ battery pack come into the pack balancing mode. A cell that is discharged when the pack balancing mode is in progress is marked by drawing a line under its voltage value.

Referring to FIG. 4, as the pack balancing mode proceeds, the pack voltages of the first battery pack, the second battery pack and the $n^{th}$ battery pack gradually decrease. As a result, the pack voltage deviation decreases to 0.7V that is lower than the first threshold value. Therefore, pack balancing for the first battery pack, the second battery pack and the $n^{th}$ battery pack is stopped.

The first battery pack and the second battery pack have cell voltage deviations of 0.18V and 0.3V, respectively, which are greater than the second threshold value. Therefore, the first battery pack and the second battery pack come into the cell balancing mode. A cell discharged in the cell balancing mode is marked by drawing a line under its voltage value. Meanwhile, the $n^{th}$ battery pack has a cell voltage deviation of 0.1V that is not greater than the second threshold value. Therefore, the cell balancing mode does not proceed for the $n^{th}$ battery pack.

Referring to FIG. 5, as cell balancing proceeds, the cell voltage deviation of the first battery pack is reduced to 0.08V, and the cell voltage deviation of the second battery pack is 0.15V, which is still greater than the second threshold value. Therefore, the cell balancing mode is stopped for the first battery pack, and the cell balancing mode is continuously applied to the second battery pack. A cell discharged in the cell balancing mode is marked by drawing a line under its voltage value.

Referring to FIG. 6, as cell balancing continues, the cell voltage deviations of the first battery pack, the second battery pack and the $n^{th}$ battery pack decrease to 0.08V, 0.07V and 0.1V, respectively, which are not greater than the second threshold value. Therefore, the balancing process according to the present disclosure is terminated since even the cell balancing mode for the second battery pack is stopped.

According to the present disclosure, since pack balancing and cell balancing are complementarily performed in a battery system including battery packs connected in parallel to reduce the voltage deviation of the battery packs, it is possible to reduce damage to electrical components and the inside of the battery pack due to an in-rush current.

In the description of the various exemplary embodiments of the present disclosure, it should be understood that the element referred to as 'unit' is distinguished functionally rather than physically. Therefore, each element may be selectively integrated with other elements or each element may be divided into sub-elements for effective implementation control logic(s). However, it is obvious to those skilled in the art that, if functional identity can be acknowledged for the integrated or divided elements, the integrated or divided elements fall within the scope of the present disclosure.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

What is claimed is:

1. An apparatus for balancing battery packs connected in parallel, which is capable of complementarily performing pack balancing and cell balancing, the apparatus comprising:

first to $n^{th}$ battery packs connected in parallel with each other and respectively including a plurality of battery cells connected in series;

a voltage measurer configured to measure voltages of the plurality of battery cells included in each battery pack;

a plurality of discharge circuits connected in parallel to correspond to the plurality of battery cells; and a processor operatively connected to the voltage measurer and the plurality of discharge circuits, wherein the processor is configured to:

measure voltages of all battery cells included in each battery pack at a predetermined time interval by means of the voltage measurer, determine a pack voltage of each battery pack from the measured voltages of the battery cells, and determine a pack voltage deviation and a cell voltage deviation of each battery pack, when the pack voltage deviation is greater than a first threshold value, determine a cell voltage corresponding to a preset criterion among the voltages of all battery cells included in the first to $n^{th}$ battery packs as a pack balancing target voltage, identify a battery cell having a higher voltage than the pack balancing target voltage among the battery cells included in each battery pack, and operate a discharge circuit connected to the identified battery cell to reduce the pack voltage deviation to the first threshold value or below, and when the pack voltage deviation is equal to or smaller than the first threshold value among the first to $n^{th}$ battery packs, identify a battery pack having a cell voltage deviation greater than a second threshold value, determine a cell voltage corresponding to a preset criterion among the voltages of the battery cells included in the identified battery pack as a cell balancing target voltage for the identified battery pack, and operate a discharge circuit connected to a battery cell having a higher voltage than the cell balancing target voltage among the battery cells included in the identified battery pack to reduce the cell voltage deviation to the second threshold value or below.

2. The apparatus for balancing battery packs connected in parallel according to claim 1,
wherein each discharge circuit includes a switch and a resistor.

3. The apparatus for balancing battery packs connected in parallel according to claim 1,
wherein the processor is configured to stop pack balancing and cell balancing when the pack voltage deviation is equal to or smaller than the first threshold value and the cell voltage deviation of each battery pack is equal to or smaller than the second threshold value.

4. The apparatus for balancing battery packs connected in parallel according to claim 1,
wherein the processor is configured to reduce the first threshold value and the second threshold value as the number of charging/discharging cycles of the battery packs connected in parallel increases.

5. The apparatus for balancing battery packs connected in parallel according to claim 1, further comprising:
a current measurer configured to measure an in-rush current flowing into each battery pack,
wherein the processor is configured to determine a maximum value of the in-rush current by measuring the in-rush current flowing into each battery pack by means of the current measurer, and reduce the first threshold value and the second threshold value according to a level of the maximum value of the in-rush current.

6. The apparatus for balancing battery packs connected in parallel according to claim 1,
wherein when the pack voltage deviation is greater than the first threshold value, the processor is configured to determine a lowest cell voltage among the voltages of all cells included in the first to $n^{th}$ battery packs or an average cell voltage of the voltages of all cells as the pack balancing target voltage.

7. The apparatus for balancing battery packs connected in parallel according to claim 1,
wherein when the pack voltage deviation is equal to or smaller than the first threshold value, the processor is configured to identify a battery pack having a cell voltage deviation greater than the second threshold value, and determine a lowest cell voltage among the voltages of the battery cells included in the identified battery pack or an average cell voltage thereof as the cell balancing target voltage for the identified battery pack.

8. A battery management system, comprising the apparatus for balancing battery packs connected in parallel according to claim 1.

9. An electric driving mechanism, comprising the apparatus for balancing battery packs connected in parallel according to claim 1.

10. A method for balancing battery packs connected in parallel, the method comprising:
by a voltage measurer, measuring voltages of all battery cells included in a plurality of battery packs at a predetermined time interval;
determining a pack voltage of each battery pack from the measured voltages of the battery cells;
determining a pack voltage deviation and a cell voltage deviation of each battery pack;
when the pack voltage deviation is greater than a first threshold value, determining a cell voltage corresponding to a preset criterion among the voltages of all battery cells included in the plurality of battery packs as a pack balancing target voltage, identifying a battery cell having a higher voltage than the pack balancing target voltage among the battery cells included in each battery pack, and operating a discharge circuit connected to the identified battery cell to reduce the pack voltage deviation to the first threshold value or below; and
when the pack voltage deviation is equal to or smaller than the first threshold value, identifying a battery pack having a cell voltage deviation greater than a second threshold value among the first to $n^{th}$ battery packs, determining a cell voltage corresponding to a preset criterion among the voltages of the battery cells included in the identified battery pack as a cell balancing target voltage for the identified battery pack, and operating a discharge circuit connected to a battery cell having a higher voltage than the cell balancing target voltage among the battery cells included in the identified battery pack to reduce the cell voltage deviation to the second threshold value or below.

11. The method for balancing battery packs connected in parallel according to claim 10, further comprising:
stopping the operation for pack balancing and cell balancing when the pack voltage deviation is equal to or smaller than the first threshold value and the cell voltage deviation of each battery pack is equal to or smaller than the second threshold value.

12. The method for balancing battery packs connected in parallel according to claim 10, further comprising:
reducing the first threshold value and the second threshold value as the number of charging/discharging cycles of the battery packs connected in parallel increases.

13. The method for balancing battery packs connected in parallel according to claim 10, further comprising:
by a current measurer, measuring an in-rush current flowing into each battery pack; and
determining a maximum value of the in-rush current and reducing the first threshold value and the second threshold value according to a level of the maximum value of the in-rush current.

14. The method for balancing battery packs connected in parallel according to claim 10,
wherein when the pack voltage deviation is greater than the first threshold value, a lowest cell voltage among the voltages of all cells included in the plurality of battery packs or an average cell voltage of the voltages of all cells is determined as the pack balancing target voltage.

15. The method for balancing battery packs connected in parallel according to claim 10,
wherein when the pack voltage deviation is equal to or smaller than the first threshold value, the battery pack having a cell voltage deviation greater than the second threshold value is identified, and a lowest cell voltage among the voltages of the battery cells included in the identified battery pack or an average cell voltage thereof is determined as the cell balancing target voltage for the identified battery pack.

16. An apparatus for balancing battery packs connected in parallel, which is capable of complementarily performing pack balancing and cell balancing, the apparatus comprising:
first to $n^{th}$ battery packs connected in parallel with each other and respectively including a plurality of battery cells connected in series;
a voltage measurer configured to measure voltages of the plurality of battery cells included in each battery pack;
a plurality of discharge circuits connected in parallel to correspond to the plurality of battery cells;
a current measurer configured to measure an in-rush current flowing into each battery pack; and
a processor operatively connected to the voltage measurer and the plurality of discharge circuits,
wherein the processor is configured to:
measure voltages of all battery cells included in each battery pack at a predetermined time interval by means of the voltage measurer, determine a pack voltage of each battery pack from the measured voltages of the battery cells, and determine a pack voltage deviation and a cell voltage deviation of each battery pack,
when the pack voltage deviation is greater than a first threshold value, determine a cell voltage corresponding to a preset criterion among the voltages of all battery cells included in the first to $n^{th}$ battery packs as a pack balancing target voltage, identify a battery cell having a higher voltage than the pack balancing target voltage among the battery cells included in each battery pack, and operate a discharge circuit connected to the identified battery cell to reduce the pack voltage deviation to the first threshold value or below, and
when the pack voltage deviation is equal to or smaller than the first threshold value among the first to $n^{th}$ battery packs, identify a battery pack having a cell voltage deviation greater than a second threshold value, determine a cell voltage corresponding to a preset criterion among the voltages of the battery cells included in the identified battery pack as a cell balancing target voltage for the identified battery pack, and operate a discharge circuit connected to a battery cell having a higher voltage than the cell balancing target voltage among the battery cells included in the identified battery pack to reduce the cell voltage deviation to the second threshold value or below, and
wherein the processor is configured to determine a maximum value of the in-rush current by measuring the in-rush current flowing into each battery pack by means of the current measurer, and reduce the first threshold value and the second threshold value according to a level of the maximum value of the in-rush current.

* * * * *